(12) United States Patent
Wittig

(10) Patent No.: US 7,002,797 B1
(45) Date of Patent: Feb. 21, 2006

(54) NOISE-REDUCING BLOWER STRUCTURE

(75) Inventor: Michael B. Wittig, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 10/740,253

(22) Filed: Dec. 17, 2003

Related U.S. Application Data

(60) Provisional application No. 60/523,134, filed on Nov. 17, 2003.

(51) Int. Cl.
 *H05K 7/20* (2006.01)
(52) U.S. Cl. ...................... 361/695; 361/690; 361/719; 165/80.3; 174/16.3; 454/184
(58) Field of Classification Search ................ 361/687, 361/690, 695, 697, 717–719; 165/80.3, 122–126; 174/16.3; 454/184; 415/213.1
See application file for complete search history.

(56) References Cited

U.S. PATENT DOCUMENTS

| | | | | |
|---|---|---|---|---|
| 5,852,547 A | * | 12/1998 | Kitlas et al. ................. | 361/695 |
| 6,198,630 B1 | * | 3/2001 | Cromwell .................... | 361/704 |
| 6,438,984 B1 | * | 8/2002 | Novotny et al. ............ | 62/259.2 |
| 6,452,797 B1 | * | 9/2002 | Konstad ...................... | 361/695 |
| 6,643,131 B1 | * | 11/2003 | Huang ......................... | 361/697 |
| 6,731,502 B1 | * | 5/2004 | Hsu ............................. | 361/695 |
| 6,779,975 B1 | * | 8/2004 | Takashima et al. ....... | 415/213.1 |

* cited by examiner

*Primary Examiner*—Boris Chervinsky
(74) *Attorney, Agent, or Firm*—Murabito & Hao LLP

(57) ABSTRACT

Embodiments of the present invention provide for a noise-reducing blower structure in which a fan-housing is disposed on an expansion card and juxtaposed to a heat sink. The heat sink is disposed on the expansion card and resides within a rigid frame above a processing unit chip. A fan that circulates air is disposed on the expansion card within the fan-housing. A duct is disposed on the expansion card, covering the heat sink and the fan-housing, and the duct is mechanically separated from the fan-housing for reducing vibration noises. By placement of the fan next to the heat sink, and not on top of it, the fan can be made larger to thereby rotate at slower speeds.

26 Claims, 8 Drawing Sheets

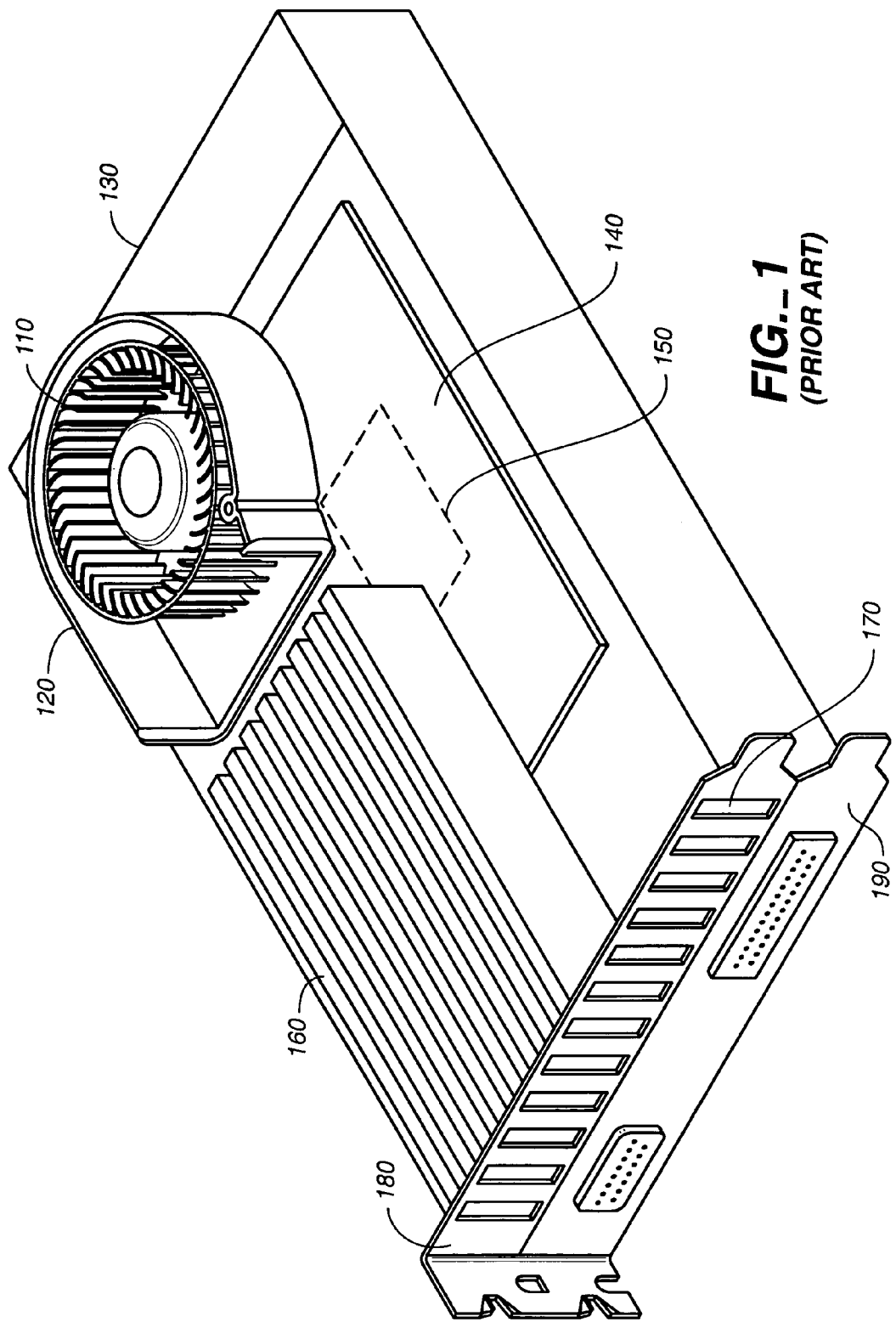
FIG._1
*(PRIOR ART)*

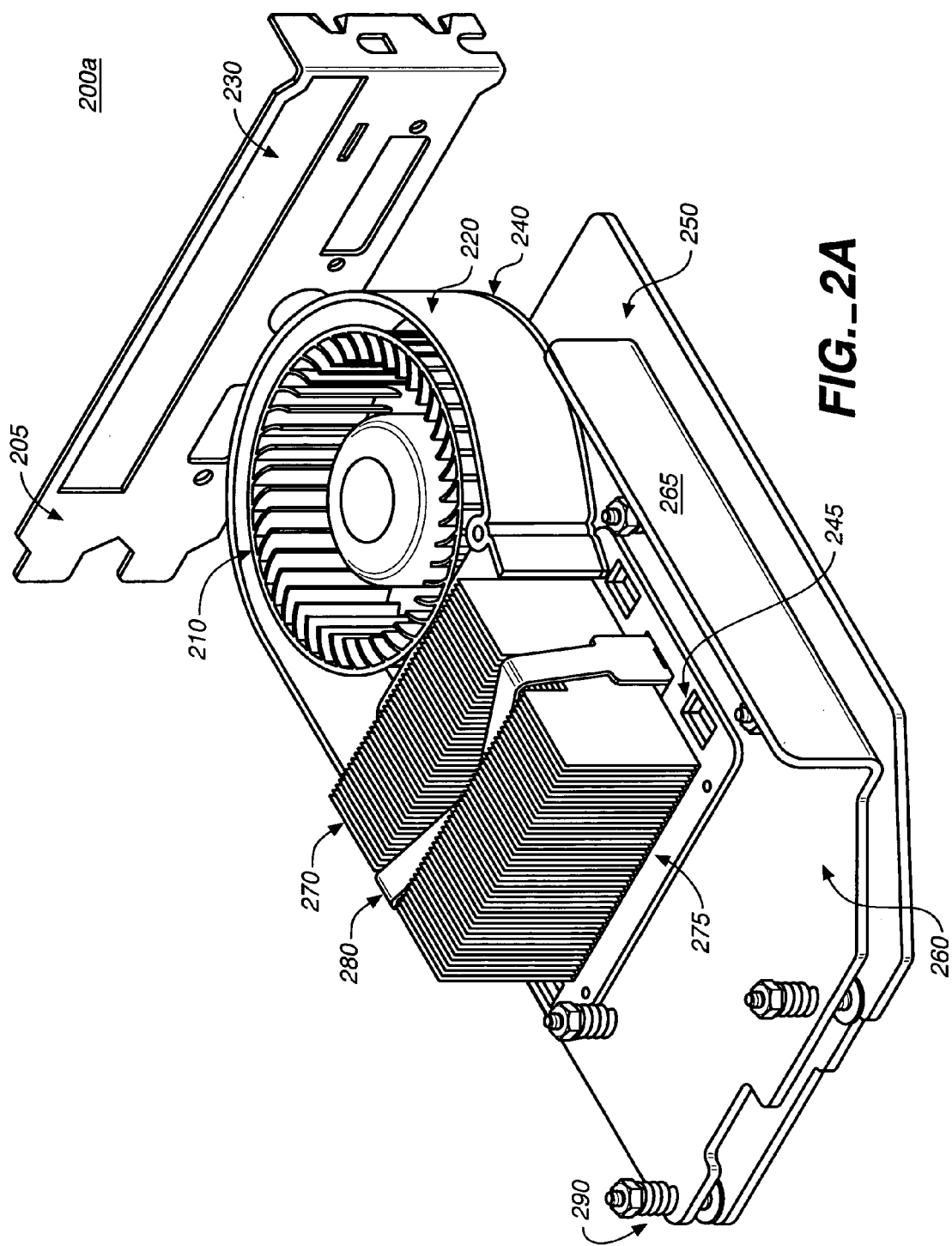
FIG._2A

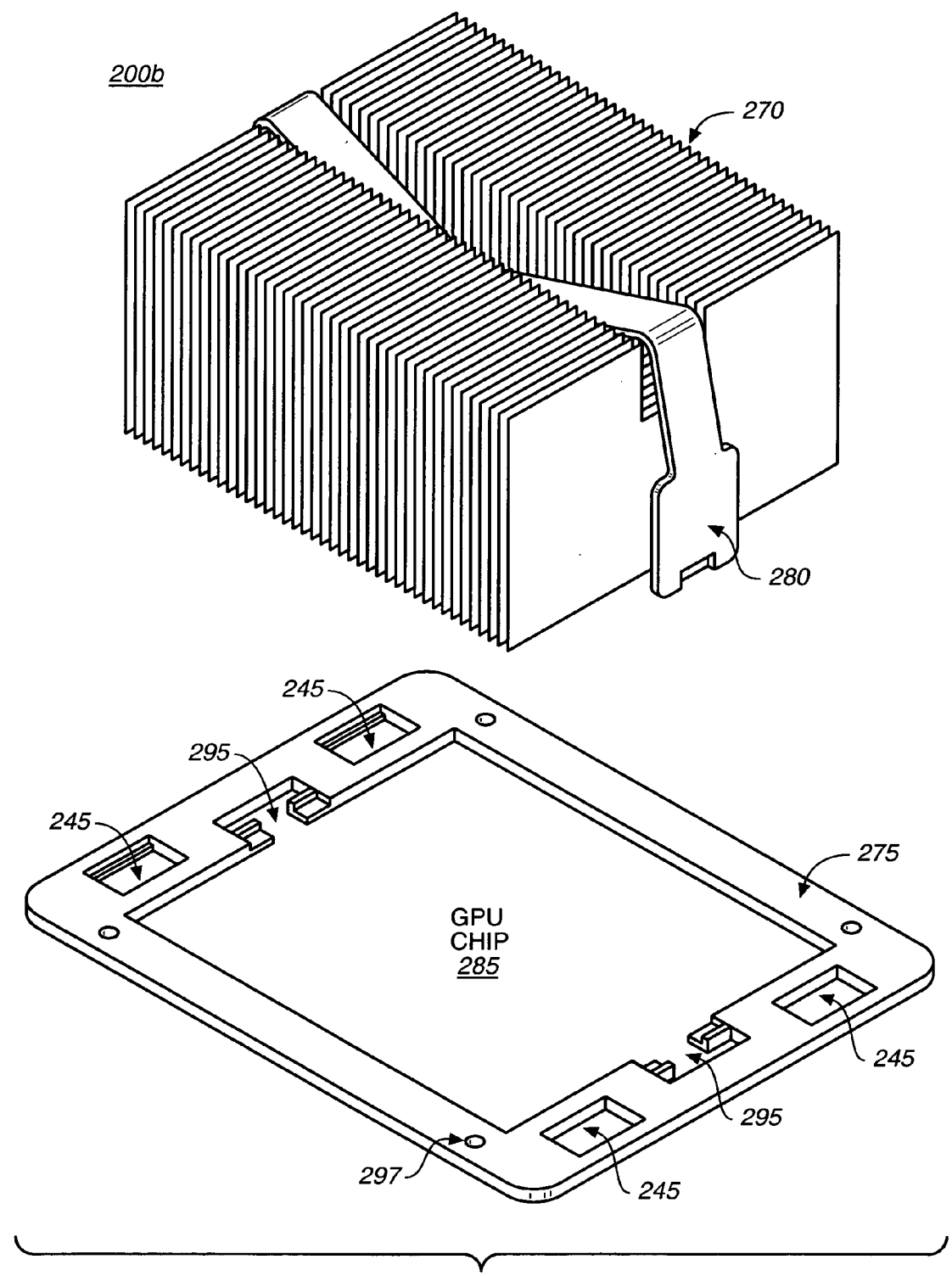
FIG._2B

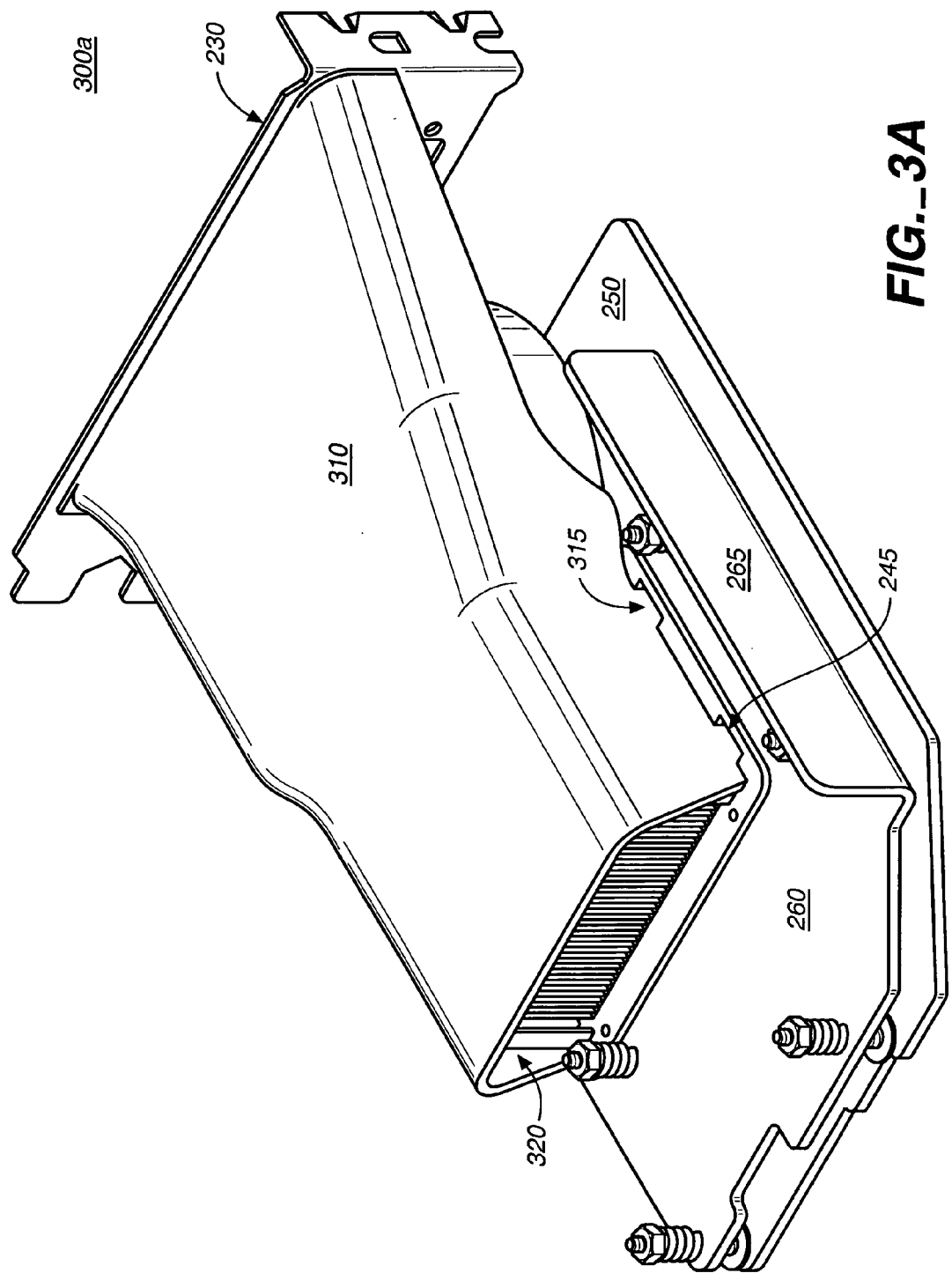
FIG._3A

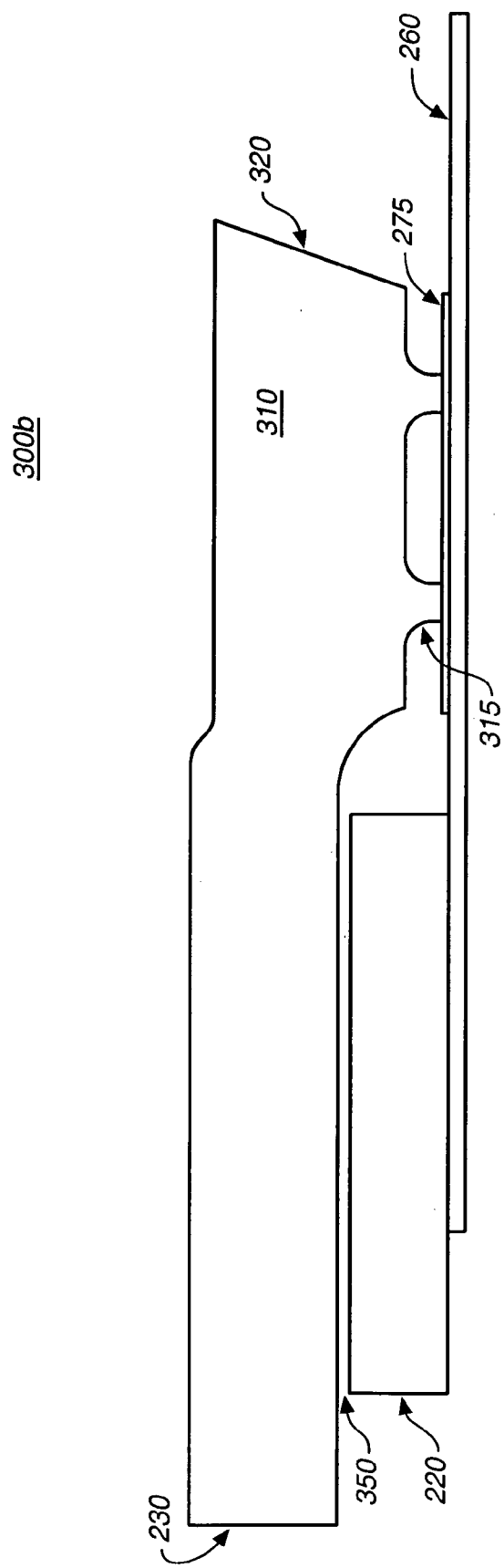
FIG._3B

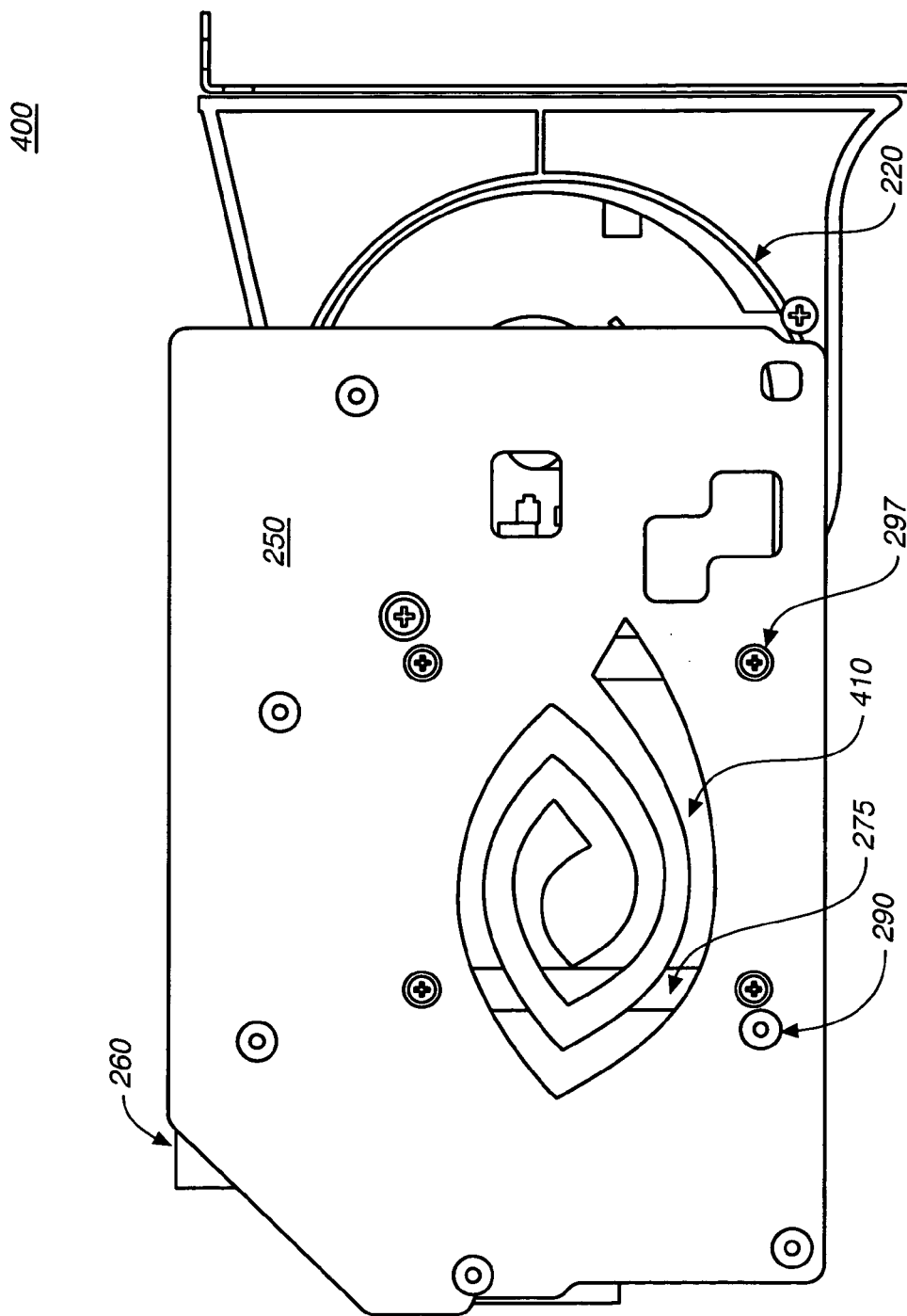
FIG._4

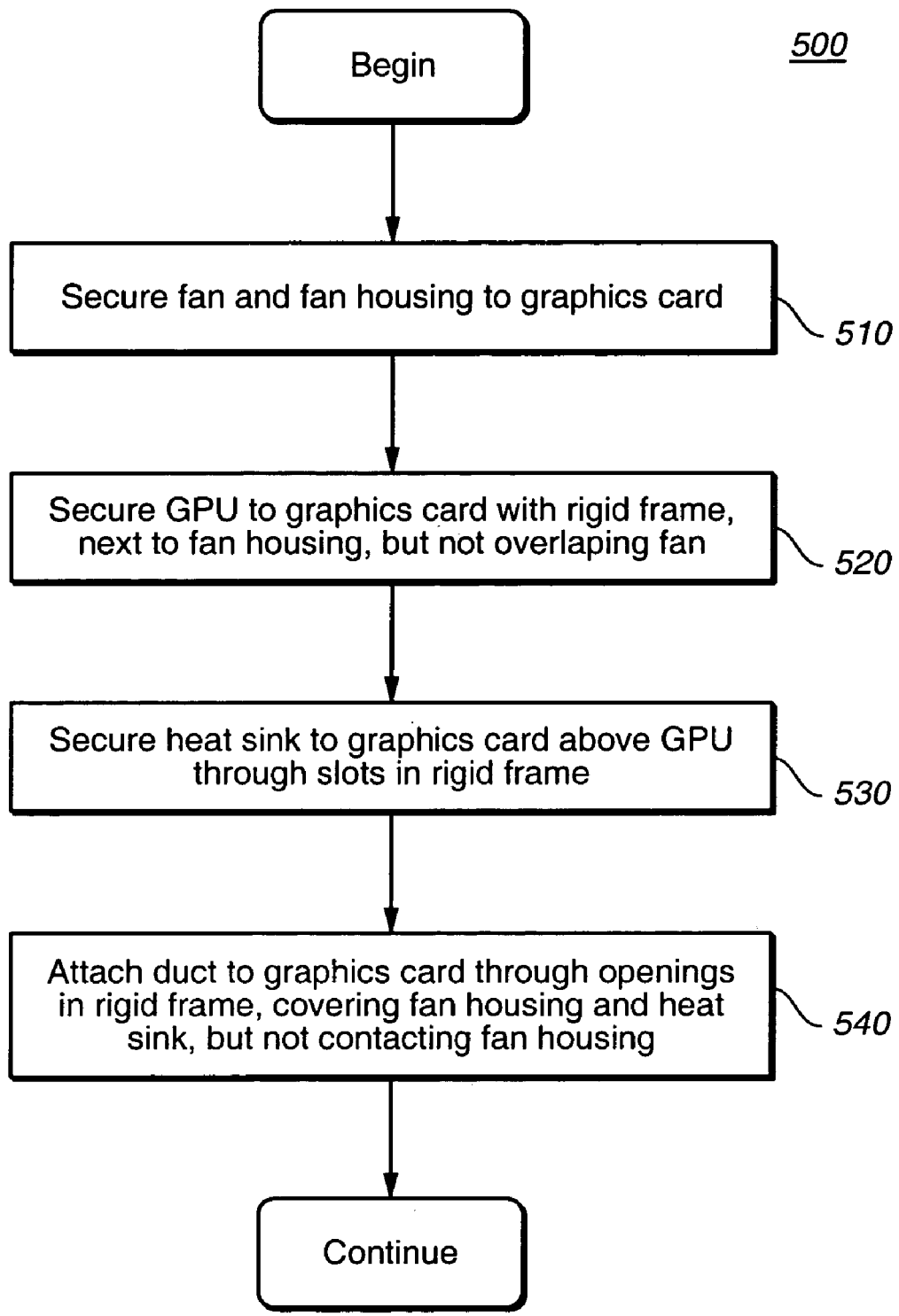
FIG._5

NOISE-REDUCING BLOWER STRUCTURE

This Application is related to and claims priority from commonly owned and invented provisional U.S. Patent Application No. 60/523,134, filed Nov. 17, 2003, by Michael B. Wittig entitled "HEAT-REMOVING BLOWER STRUCTURE WITH IMPROVED ACOUSTICAL CHARACTERISTICS," and hereby incorporated by reference herein in its entirety.

FIELD OF THE INVENTION

Embodiments of the present invention relate to blower structures for cooling components in computer systems, and more particularly to reducing noise produced by the blower structures.

BACKGROUND OF THE INVENTION

Many computer systems today are being equipped with expansion cards. Some cards contain a graphics processing unit (GPU) that is used primarily for 3-D applications, creating lighting effects and transforming objects each time a 3D scene is redrawn. The GPU is a single-chip processor that is capable of performing these mathematically intensive tasks and, thus, removing the burden of these calculations from the CPU. The GPU can perform billions of calculations per second, processing a minimum of ten million polygons per second and having over 22 million transistors.

The GPU generates a very large amount of heat that needs to be removed. In order to remove the heat, a blower structure, containing a cooling fan and ducting, and a heat sink are employed. Fans typically vibrate due to mass imbalance in their rotors. Such vibration is readily transmitted to air via a surface, such as a rigid fan-housing, causing sound to be produced. The cooling fan in the blower structure of a typical GPU card runs fairly quietly at low speed when not in a 3-D mode. However, when an application that is running enters a 3-D mode, the fan switches to full speed. At full speed, the noise level increases, remarkably, to around 45 decibels or higher. This noise level has been cited to be an irritation to users.

Prior Art FIG. 1 illustrates a typical configuration of a conventional heat removal system used to remove heat generated by a GPU. GPU 150, according to one embodiment of the conventional art, resides beneath a copper plate heat sink 140. Fan 110 is mounted on top of heat sink 140 with a portion of its impeller overlapping the GPU. Fan 110 is contained in a housing that forms a duct 120 for directing the air from fan 110 over heat sink 160. Together, fan 110, its housing and duct 120, comprise the blower structure that is mounted on top of the GPU. Heat sink 160 is a copper heat sink, having a series of fins. There is a second housing 130 that forms an a duct for directing ambient air that enters through intake openings 170 in mounting bracket 190 and enters fan 110 over the top of the fan motor for aiding in the removal of heat generated by GPU 150. The air passing over heat sink 160 is exhausted through an opening 180 in bracket 190.

Duct 120 of Prior Art FIG. 1 has an acoustical effect. Its design causes sound waves that are generated within the duct by the fan and fan motor to be amplified. Any additional vibrations and/or noise, such as those from the fan motor that is slightly off balance or from electrical noise, will contribute further to the sound that is generated. The large amount of sound (45 to 50 db), that is observed to be generated when fan 110 runs at high speed, creates an annoyance for many users.

Another problem with the card configuration of FIG. 1 is that having the fan structure mounted on top of the GPU and the heat sink mounted on top of the fan structure creates a thick design. Often the GPU card takes up two or more slots on the computer system due to the thickness of the design.

In addition to the noise produced, there is an additional problem with the GPU card with regard to its flexibility. The GPU chip is fairly fragile, in that it contains balls that are easily broken away if the chip is flexed. The card has exhibited a flexibility, when dropped, which allows the GPU chip to break. Both the noise factor and the GPU chip breakage due to flexing of the card present undesirable features of the conventional GPU card.

SUMMARY OF THE INVENTION

There is a need for reducing the noise generated by the blower structure in the heat removal system of an expansion card containing a processing unit chip. According to embodiments of the present invention, a noise-reducing blower structure is disclosed in which a fan-housing is coupled to a graphics card (having a graphics processing unit) and juxtaposed to a heat sink. In one embodiment a duct and fan housing are constructed out of a material having excellent vibration dampening characteristics. In addition, the fan housing is mechanically separated from the duct by a dampening space. In one embodiment, the heat sink is coupled to the graphics card and resides within a rigid frame above the graphics processing unit chip. In one embodiment, a fan that circulates air is coupled to the graphics card within the fan-housing. A duct is coupled to the graphics card, in one embodiment, covering the heat sink and the fan-housing, and the duct is separated from the fan-housing for reducing vibration noises.

Embodiments of the present invention advantageously improve the noise produced by the heat removal system of a GPU card. Embodiments of the present invention are also advantageous in that the frame for the heat sink combined with the relative locations of the GPU chip and the heat sink, increase the structural stiffness of the GPU card at the GPU chip location and reduce the breakage rate of the GPU chip. Embodiments of the present invention are also advantageous in that the design of the GPU heat sink provides a larger surface area for heat dissipation at a location nearest to the GPU chip, thus providing increased heat dissipation where needed.

BRIEF DESCRIPTION OF THE DRAWINGS

The accompanying drawings, which are incorporated in and form a part of this specification, illustrate embodiments of the invention and, together with the description, serve to explain the principles of the invention:

Prior Art FIG. 1 shows an exemplary heat removal system for a GPU card according to the conventional art.

FIG. 2A illustrates a top view of a heat removal system for reducing noise in an expansion card (duct removed), in accordance with one embodiment of the present invention.

FIG. 2B is an exploded view of a processor integrated circuit device, frame and heat sink, in accordance with one embodiment of the present invention.

FIG. 3A illustrates a top view of a heat removal system for reducing noise in an expansion card (duct in place), in accordance with one embodiment of the present invention.

FIG. 3B is a side view of a heat removal system for reducing noise in an expansion card (duct in place), in accordance with one embodiment of the present invention.

FIG. 4 illustrates a bottom view of a heat removal system for an expansion card, according to one embodiment of the present invention.

FIG. 5 is a flowchart of the steps in an assembly process for reducing noise in the blower structure of an expansion card, in accordance with one embodiment of the present invention.

DETAILED DESCRIPTION OF THE INVENTION

Figure 2C:
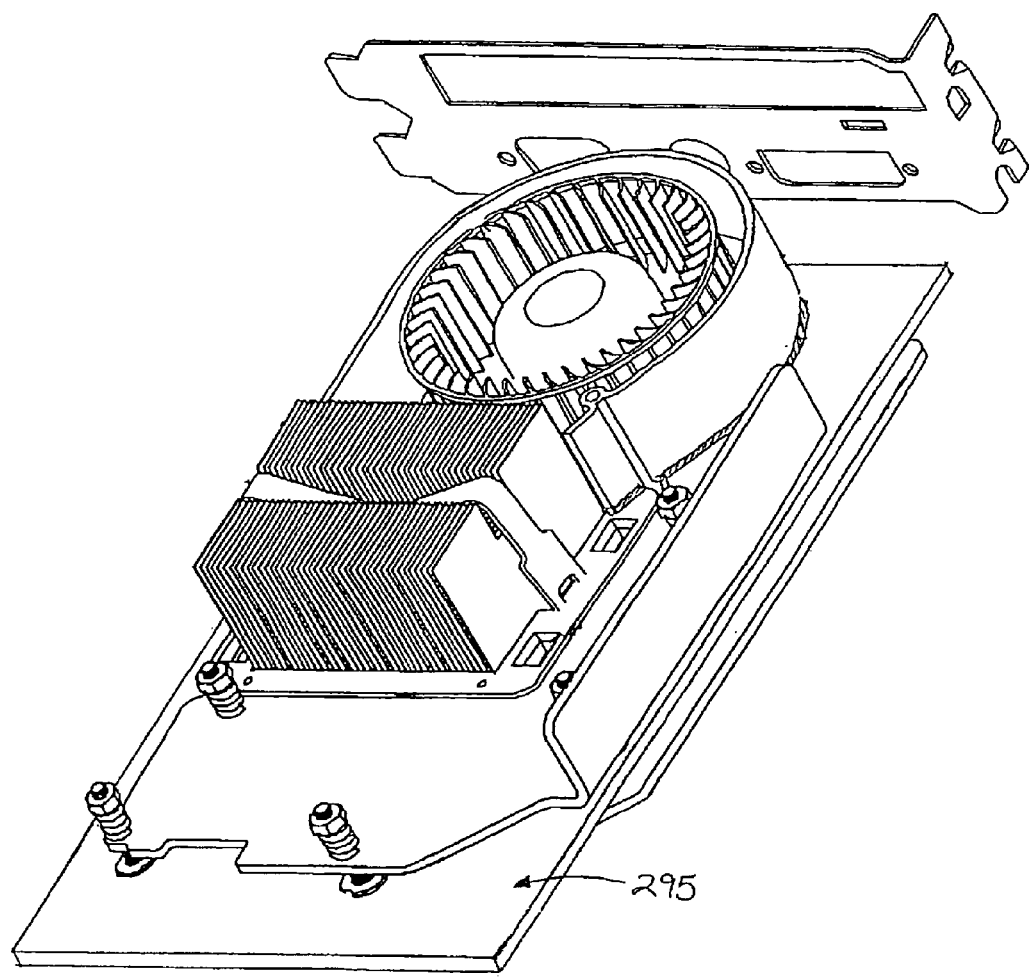
FIG. 2C illustrates a top view of a heat removal system for reducing noise in an expansion card (duct removed), in accordance with one embodiment of the present invention.

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Fans typically vibrate due to mass imbalance in their rotors. Such vibration is readily transmitted to air by way of a surface, thus producing sound. If the vibrations are of a high frequency and have a large amplitude, a fairly loud noise can be produced. This noise may become annoying to users of a device with such a fan. The present invention may be operable in an expansion card and acts to reduce noise by damping the vibration source of the sound and by separating it from larger surfaces that can effectively couple the vibration to the air. Other sources of noise can be the flow of air through the intake and exhaust ports, the noise from the motor driving the fan and electrical noises associated with pulse width modulation circuitry.

Referring now to the embodiment of the present invention shown in FIGS. 2A, 2B, and 2C, in FIG. 2A a top view 200a of a heat removal system designed for reducing noise in a computer system expansion card is illustrated, with circuit card and duct removed; FIG. 2B is an exploded view 200b of a processor integrated circuit device or "chip," frame and heat sink; in FIG. 2C a top view 200c of a heat removal system designed for reducing noise in a computer system expansion card is illustrated, with exemplary circuit card 295 in place and duct removed. Embodiments of the present invention may be practical in any type of expansion card, and the discussions regarding a graphics card with graphics processor are only one example. The embodiments of the present invention could equally apply to other cards having processors or controller chips such as sound cards, etc. In one embodiment, the expansion card is a graphics card having a graphics processing unit to be cooled.

The heat removal system, also referred to as a blower structure, is illustrated with the printed circuit board removed for clarity and simplicity in describing the present invention. The graphics card is inserted into a cabinet slot in a computer and bracket 205 is designed so that the graphics card occupies at least one slot in the cabinet. A second slot may also be obstructed. The GPU 285, which is a single-chip processor, is shown in FIG. 2B, and occupies an area approximately the size of the footprint of heat sink 270. GPU 285 is an integrated circuit device or "chip" and is located directly below heat sink 270. The GPU 285 generates a very large amount of heat that needs to be removed. In order to remove the heat, the heat removal system (blower structure), containing low noise cooling fan 210, heat sink 270 and ducting (shown in FIGS. 3A and 3B) are employed.

In one embodiment of the present invention, fan 210 sits near the end of the graphics card that is closest to bracket 205. Fan 210 is housed in fan-housing 220. A large opening 230 in bracket 205 provides an intake for ambient air that is then directed into fan housing 220 for cooling heat sink 270 that is located next to fan 210. Heat sink 270 may, in one embodiment, be constructed of copper. In another embodiment, heat sink 270 may be constructed of any material that exhibits high heat conductivity. Opening 230 is larger in size than in the conventional art, allowing for a lower velocity of air moving through intake opening 230 during fan operation. This lower velocity helps to reduce the noise from the air moving through intake opening 230. Heat sink 270 is located directly over the GPU 285. As explained in more detail below, the relative location of these components provides for an indirect noise reduction in that it allows a sufficiently large fan impeller to move a large amount of air per rotation. This, in turn, allows a reduction in impeller speed from that of conventional heat removal systems. In conventional systems the height of the fan was limited due to its being placed above the GPU and, in some cases, on the heat sink. Sound energy has been shown to increase according to the sixth power of the rotation speed. Therefore, any means of reducing rotation speed will be accompanied by a noticeable reduction in sound level. The embodiments of the present invention advantageously place the fan near but not over the processor, thereby allowing for larger impellers which provide slower rotation speeds to move the same air mass compared to conventional systems.

Still referring to FIGS. 2A and 2B, fan-housing 220 of FIG. 2A is designed such that it is mechanically separated from the duct (see duct 310 of FIGS. 3A and 3B), according to one embodiment of the present invention. The duct may rest on spacers located beyond the fan housing and is designed to sit above fan-housing 220 and above heat sink 270 and directs the cooling air through the fan 210 and over heat sink 270. The duct may be constructed of nylon and is attached so as to leave a small (0.5–1.0 mm) space (see space 350 of FIG. 3B) between it and fan-housing 220, thereby removing an amplification effect that is observed when the duct is a rigid part of a fan-housing. Thus, the fan rotor can vibrate without conducting the vibrations into the duct 310.

According to one embodiment, fan-housing 220 is rigidly attached to the graphics card through metal plates 250 and 260. In another embodiment, fan-housing 220 is mounted on a strip of baffling material 240. This baffling material 240 may, according to one embodiment, be a rubber material. In another embodiment, the baffling material 240 may be a soft plastic material. The baffling material 240, however, is not limited to rubber or soft plastic, and may be any material that baffles or otherwise dampens the vibrations in fan-housing 220 so as to reduce the production of noise.

According to one embodiment of the present invention, metal plates 250 and 260 of FIG. 2A are secured to each side of the printed circuit board, plate 260 on the top and plate 250 on the bottom, with a number of screws such as screw 290. Screw 290 comprises a spring for allowing plates 260 and 250 to float relative to the circuit board. Metal plates 250 and 260 can also serve as a heat sink for dissipating heat generated by memory chips that reside between them on the circuit board. Metal plate 260 is bent in a 90-degree angle on one side, producing surface 265. Plate surface 265 allows for additional area for dissipating heat than would have been available if plate 260 were not bent. In addition, it provides a surface that is visible within the cabinet, on which a logo may be placed to identify the manufacturer of the graphics card. Plates 250 and 260 and the devices, such as fan 210, fan housing 220, duct 310, etc. that are affixed to them are referred to herein as an assembly.

Still referring to FIGS. 2A and 2B, in one embodiment of the present invention, as shown in FIG. 2B, heat sink 270 sits above GPU chip 285, which is secured to the assembly by rigid GPU frame 275. Frame 275 sits over the edges of GPU 285 and is secured by self-tapping screws 297 that go from the back of the board, through the frame. GPU frame 275 performs several functions. One very important function of GPU frame 275 is to stiffen the circuit board in the critical area around GPU 285, according to one embodiment. GPU 285 is fragile and susceptible to breakage when flexed. By securing it with GPU frame 285, the potential for breaking the GPU is reduced. Since heat sink 270 resides above GPU 285 and is quite heavy, GPU frame 275 acts as a means for distributing the load in the case of dropping the assembly. If the assembly is dropped, the circuit board hits first and, because a heat sink is heavy, there will be acceleration between the circuit board and the heat sink. In a conventional design, a heat sink is held to the board with metal pins and this acceleration places a high force on the pins. The pins, in turn, could bend and damage the circuit board by shorting out embedded circuitry. Thus, upon being dropped, the heat sink 270 in the assembly rams into GPU frame 275 and frame 275 distributes the forces.

Another function of GPU frame 285 of FIG. 2B is to provide a means for securing heat sink 270 above GPU 285. Slots 295 accept and secure the ends of clip 280 that holds heat sink 270 to the assembly. Another function of GPU frame 275 is to provide a means for securing a duct (e.g., duct 310 of FIGS. 3A and 3B) that is designed to reduce the noise level in heat removal system 200a, thus allowing the duct to reside above fan-housing 220 and heat sink 270 without contacting fan-housing 220. This is illustrated in FIG. 3B, showing gap 350 between fan-housing 220 and duct 310. The duct has four tabs 315 that clip into the four slots 245 in GPU frame 275.

Clip 280 is designed in an "M" configuration that creates a spring for holding it in slot 295 of GPU frame 275 according to one embodiment of the present invention. This allows heat sink 270 to be designed with heat removal fins only partially shortened beneath the location for clip 280, creating a shallow trough, longitudinally, over the center of heat sink 270. Thus, heat sink 270 has a greater surface area and, consequently, greater heat removal capability than that of previous GPU heat removal systems. In conventional designs, a deep slit may be formed in the center of the heat sink for attaching the heat sink to the board. In such designs, one side of the heat sink is disconnected from the other, and it is difficult for the conventional heat sink to equalize temperatures. Heat sink 270 of an embodiment of present invention allows for balancing the heat across the heat sink due to the presence of fins in the center, beneath the "M" shaped clip 280. It also provides more heat removal at the hottest location, that being directly above chip 285.

Referring now to FIGS. 3A and 3B, FIG. 3A, illustrating a top view 300 of a heat removal system for reducing noise in an expansion card with duct 310 in place, is presented in accordance with one embodiment of the present invention. FIG. 3B is a side view of a heat removal system for reducing noise in an expansion card with duct 310 in place. FIGS. 3A and 3B are discussed in concert so as to facilitate the description of embodiments of the present invention. Duct 310 is, according to one embodiment, constructed of nylon or of a clear plastic material. In other embodiments duct 310 may be of any material, transparent, translucent or opaque, that is sufficiently rigid to hold its shape, and shaped to direct air into a fan and over a heat sink (e.g., fan 210 and heat sink 270 of FIG. 2A).

Duct 310 sits above the fan-housing (e.g., fan-housing 220 of FIG. 2A) and directs the cooling air through the fan and over heat sink. Duct 310 is attached so as to leave a small (0.5–1.0 mm) space 350 between it and the fan-housing 220, thereby mechanically isolating these elements to remove an amplification effect that is observed when the duct is a rigid part of a fan-housing, as in the conventional assembly. Thus, the fan rotor can vibrate without conducting the vibrations into the duct, where the vibrations are susceptible to being amplified, and significantly remove the noise attributed to the assembly.

Duct 310, according to one embodiment, is held in place by four tabs 315 that clip into slots 245 in rigid frame 275. This allows duct 310 to sit above fan 210, with a small gap 350 between duct 310 and fan-housing 220, while directing ambient air through a large intake opening 230, into fan 210 and over heat sink 270, and out at exhaust area 320. The design of duct 310 allows a larger amount of air per rotation to be taken in through opening 230, thus reducing the velocity at the intake and the associated airflow noise. This also improves the heat removal capacity of the blower structure.

FIG. 4 illustrates a bottom view 400 of a heat removal system for an expansion card, according to one embodiment of the present invention. Once again, the assembly is shown without the circuit board for simplicity in describing its features. Part of the underside of fan-housing 220 is shown at the intake end of the graphics card. Screws 297 secure the GPU frame 275 to the card through the two metal plates and the circuit board. Opening 410 in metal plate 250 is below the location of the GPU chip (e.g., GPU chip 285 of FIG. 2B) and allows an additional exit for heat generated by GPU 285. The location of GPU frame 275 is shown through opening 410, but it should be understood that, with the printed circuit board in place between metal plates 250 and 260, GPU frame 275 would not be visible from the bottom view of a fully assembled graphics card. Screw 290, along with five others, attach metal plates 250 and 260 and the heat removal system to a printed circuit board, thus making up the graphics card.

FIG. 5 is a flowchart of the steps in an assembly process 500 for reducing noise in the heat removal system of an expansion card, in accordance with one embodiment of the present invention. At step 510, a fan and fan-housing (e.g., fan 210 and fan-housing 220 of FIG. 2A) are secured to a graphics card. The graphics card is designed to reserve two slots in a computer cabinet, and a bracket (e.g., bracket 205 of FIG. 2A) for securing the graphics card in the cabinet has a large opening that allows a large volume of air to enter. In one embodiment, the fan is located next to the bracket and close to the large opening, thereby taking in a maximum amount of the intake air and directing it, by means of a duct (e.g., duct 310 of FIG. 3) to remove heat being produced in the graphics card. Because the fan is the sole component of the heat removal system that resides in its location, according to one embodiment, it is possible for the size of the fan's impeller to be increased sufficiently to allow a reduction in fan speed in order to move the same quantity of air from that of impeller blades that are smaller to fit the size of a single slot or to allow for a stack up of components (e.g., GPU and heat sink) beneath it. This reduction in fan speed can reduce the noise that is produced within the heat removal system.

In step 520 of FIG. 5, an integrated circuit device chip, e.g., a GPU chip is secured to the graphics card next to the fan-housing with a rigid frame, according to one embodiment of the present invention. The GPU is a single-chip processor that is capable of performing mathematically intensive tasks and, thus, removing the burden of these calculations from the CPU. The GPU can perform billions of calculations per second, processing a minimum of ten million polygons per second and having over 22 million transistors. Thus, the GPU chip is a major source of heat produced within the graphics card. Therefore, the GPU is located within the heat removal system.

In one embodiment the rigid frame (e.g., GPU frame 275 of FIG. 2B) sits over the edges of the GPU chip and is secured by self-tapping screws that go from the back of the board, through the frame. The rigid frame performs several functions. One very important function of GPU frame is to stiffen the circuit board in the critical area around GPU, according to one embodiment. The GPU is fragile and susceptible to breakage when flexed. By securing it with the GPU frame, the potential for breaking the GPU is reduced. The GPU frame also acts, according to one embodiment, as a means for distributing the load in the case of dropping the graphics card.

In step 530 of FIG. 5, a heat sink is secured to the graphics card above the GPU chip through slots in the rigid frame. This is yet another function of GPU frame. An "M" shaped metal clip fits over a shallow groove cut out of the top of fins in the heat sink and clips into the slots in the rigid frame. By locating the heat sink next to the fan, the fan, together with the duct, can direct a large percentage of the intake air over the heat sink. By positioning the heat sink directly above the GPU, a maximum amount of the cooling capacity of the heat removal system is concentrated at the source of the maximum amount of heat generated.

In step 540 of process 500, a duct (e.g., duct 310 of FIG. 3) is secured to the graphics card at the rigid frame. The duct covers the fan, fan-housing and heat sink and directs the cooling air through the fan and over heat sink, but does not contact the fan and fan-housing. By separating the fan-housing and the duct, so as to leave a small (0.5–1.0 mm) space between them, the amplification effect that is observed when the duct is a rigid part of a fan-housing is removed. Thus, the fan rotor can vibrate without conducting the vibrations into the duct, where the vibrations are susceptible to being amplified, and significantly remove the noise produced in the graphics card. Process 500 is now exited.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A heat-removing blower structure comprising:
   a fan-housing disposed within an expansion card and juxtaposed to a heat sink, said heat sink disposed within said expansion card;
   a fan for circulating air, said fan located within said fan-housing; and
   a duct disposed to cover said heat sink and said fan-housing, wherein said duct is mechanically separated from said fan-housing by an air gap, wherein said air gap is for reducing translation of vibration noises from said fan to said duct.

2. The blower structure as described in claim 1 further comprising vibration-absorbing spacers and wherein said fan-housing is mounted on said vibration-absorbing spacers.

3. The blower structure of claim 2 wherein said vibration-absorbing spacers are rubber.

4. The blower structure of claim 1 wherein said fan-housing is rigidly mounted on said expansion card.

5. The blower structure of claim 1 wherein said fan-housing is constructed of nylon.

6. The blower structure of claim 1 wherein said heat sink is disposed on said expansion card through slots in a rigid frame, said rigid frame for surrounding and securing a processing unit chip to said expansion card.

7. The blower structure of claim 6 wherein said duct is configured to direct ambient air over said fan and exhaust said air over said heat sink and wherein said duct is disposed on said expansion card through openings in said rigid frame.

8. The blower structure of claim 7 wherein said expansion card is a graphics card and wherein said processing unit chip is a graphics processor unit chip.

9. An expansion card for a computer, comprising:
   a heat sink disposed on an assembly;
   a fan-housing disposed on said assembly and juxtaposed to said heat sink;
   a fan for circulating air, said fan disposed within said fan-housing; and
   a duct disposed to cover said heat sink and said fan-housing, wherein said duct is mechanically separated from said fan-housing by an air gap, wherein said air gap is for reducing translation of vibration noises from said fan to said duct.

10. The expansion card of claim 9 further comprising vibration-absorbing spacers and wherein said fan-housing is mounted on said vibration-absorbing spacers.

11. The expansion card of claim 10 wherein said vibration-absorbing spacers are rubber.

12. The expansion card of claim 10 wherein said vibration-absorbing spacers are soft plastic.

13. The expansion card of claim 9, wherein said fan-housing is rigidly mounted on said assembly.

14. The expansion card of claim 9 wherein said fan-housing is constructed of nylon.

15. The expansion card of claim 9 wherein said heat sink is coupled to said graphics card through slots in a rigid frame, said rigid frame surrounding and securing a processing unit chip to said assembly.

16. The expansion card of claim 15 wherein said duct is configured to direct ambient air over said fan and exhaust said air over said heat sink and said duct is disposed on said assembly through openings in said rigid frame.

17. The expansion card of claim 16 wherein said expansion card is a graphics card and wherein said processing unit chip is a graphics processor unit chip.

18. A method of assembling a blower structure of an expansion card, said method comprising:
  securing a fan and fan-housing to said expansion card;
  securing a heat sink to said expansion card, next to said fan-housing, above a processing unit chip, said processing unit surrounded by a rigid frame; and
  attaching a duct to said expansion card at said rigid frame, said duct covering said fan-housing and said heat sink, and said duct being mechanically separated from said fan-housing by an air gap, wherein said air gap is for reducing translation of vibration noises from said fan to said duct.

19. The method as described in claim 18, wherein said fan-housing is mounted on vibration-absorbing spacers.

20. The method as described in claim 19 wherein said vibration-absorbing spacers are rubber.

21. The method as described in claim 19 wherein said vibration-absorbing spacers are soft plastic.

22. The method as described in claim 18, wherein said fan-housing is rigidly mounted on said expansion card.

23. The method as described in claim 18 wherein said fan-housing is constructed of nylon.

24. The method as described in claim 18 wherein said heat sink is coupled to said expansion card through slots in said rigid frame.

25. The method as described in claim 24 wherein said duct is coupled to said expansion card through openings in said rigid frame and configured to direct ambient air over said fan and exhaust said air over said heat sink.

26. The method of claim 25 wherein said expansion card is a graphics card and wherein said processing unit chip is a graphics processor unit chip.

* * * * *